United States Patent
You et al.

(10) Patent No.: US 6,271,273 B1
(45) Date of Patent: Aug. 7, 2001

(54) POROUS MATERIALS

(75) Inventors: Yujian You, North Wales; Angelo A. Lamola, Worcester; Robert H. Gore, Southampton; Michael K. Gallagher, Landsdale; Nikoi Annan, Willow Grove, all of PA (US)

(73) Assignee: Shipley Company, L.L.C., Marlborough, MA (US)

( * ) Notice: Subject to any disclaimer, the term of this patent is extended or adjusted under 35 U.S.C. 154(b) by 0 days.

(21) Appl. No.: 09/685,750

(22) Filed: Oct. 10, 2000

Related U.S. Application Data

(63) Continuation-in-part of application No. 09/616,851, filed on Jul. 14, 2000, now abandoned.

(51) Int. Cl.[7] .................................................. C08J 9/26
(52) U.S. Cl. ................ 521/61; 521/77; 521/86; 521/88; 521/154; 438/624; 438/781
(58) Field of Search ................ 521/77, 86, 88, 521/134, 154, 189, 61, 63

(56) References Cited

U.S. PATENT DOCUMENTS

| | | |
|---|---|---|
| 5,700,844 | 12/1997 | Hedrick et al. . |
| 5,776,990 | 7/1998 | Hedrick et al. . |
| 5,863,996 | 1/1999 | Graham . |
| 5,895,263 | 4/1999 | Carter et al. . |
| 6,074,695 * | 6/2000 | Kobayashi et al. ............... 427/245 |
| 6,093,636 | 7/2000 | Carter et al. . |

FOREIGN PATENT DOCUMENTS

| | | |
|---|---|---|
| 11-322992 | 11/1999 | (JP) . |
| WO 00/31183 | 6/2000 | (WO) . |
| WO/0031183 | 6/2000 | (WO) . |
| WO/0061834 | 10/2000 | (WO) . |

OTHER PUBLICATIONS

Carter et al., "Polyimide Nanofoams From Phase–Separated Block Copolymers", Electrochemical Society Proceedings, vol. 97–8, pp. 32–43, (1977).

Carter et al., "Polyimide Nanofoams for Low Dielectric Applications", Mat. Res. Soc. Symp. Proc. vol. 381, pp. 79–91, (1995) Materials Research Society.

* cited by examiner

*Primary Examiner*—Rachel Gorr
*Assistant Examiner*—Melanie Bagwell
(74) *Attorney, Agent, or Firm*—S. Matthew Cairns

(57) ABSTRACT

Porous organo polysilica dielectric materials having low dielectric constants useful in electronic component manufacture are disclosed along with methods of preparing the porous organo polysilica dielectric materials. Also disclosed are methods of forming integrated circuits containing such porous organo polysilica dielectric materials.

26 Claims, No Drawings

POROUS MATERIALS

This application is a continuation-in-part application Ser. No. 09/616,851 filed on Jul. 14 2000, now abandoned.

BACKGROUND OF THE INVENTION

This invention relates generally to porous materials. In particular, this invention relates to the preparation and use of porous films containing organo polysilica materials and having a low dielectric constant.

As electronic devices become smaller, there is a continuing desire in the electronics industry to increase the circuit density in electronic components, e.g., integrated circuits, circuit boards, multichip modules, chip test devices, and the like without degrading electrical performance, e.g., crosstalk or capacitive coupling, and also to increase the speed of signal propagation in these components. One method of accomplishing these goals is to reduce the dielectric constant of the interlayer, or intermetal, insulating material used in the components. A method for reducing the dielectric constant of such interlayer, or intermetal, insulating material is to incorporate within the insulating film very small, uniformly dispersed pores or voids.

Porous dielectric matrix materials are well known in the art. One known process of making a porous dielectric involves co-polymerizing a thermally labile monomer with a dielectric monomer to form a block copolymer, followed by heating to decompose the thermally labile monomer unit. See, for example, U.S. Pat. No. 5,776,990. In this approach, the amount of the thermally labile monomer unit is limited to amounts less than about 30% by volume. If more than about 30% by volume of the thermally labile monomer is used, the resulting dielectric material has cylindrical or lamellar domains, instead of pores or voids, which lead to interconnected or collapsed structures upon removal, i.e., heating to degrade the thermally labile monomer unit. See, for example, Carter et. al., Polyimide Nanofoamsfrom Phase-Separated Block Copolymers, *Electrochemical Society Proceedings*, volume 97–8, pages 32–43 (1997).

Thus, the block copolymer approach provides only a limited reduction in the dielectric constant of the matrix material.

Another known process for preparing porous dielectric materials disperses thermally removable particles in a dielectric precursor, polymerizing the dielectric precursor without substantially removing the particles, followed by heating to substantially remove the particles, and, if needed, completing the curing of the dielectric material. See, for example, U.S. Pat. No. 5,700,844. In the '844 patent, uniform pore sizes of 0.5 to 20 microns are achieved. However, this methodology is unsuitable for such electronic devices as integrated circuits where feature sizes are expected to go below 0.25 microns.

U.S. patent application Ser. No. 09/460,326 (Allen et al.), discloses porogen particles that are substantially compatibilized with B-staged dielectric matrix materials. However, this patent application does not broadly teach how to prepare porous dielectric layers containing organo polysilica materials.

U.S. Pat. No. 5,895,263 (Carter et al.) discloses a process for manufacturing an integrated circuit device containing an organo polysilica porous dielectric layer. In this patent, the porous organo polysilica layer was prepared by incorporating a decomposable polymer. A long list of decomposable polymers is disclosed, including cross-linked, insoluble nanospheres. The '263 patent does not disclose how to prepare such nanospheres nor how to compatibilize such nanospheres with the organo polysilica dielectric matrices.

Other methods of preparing porous dielectric materials are known, but suffer from broad distributions of pore sizes, too large pore size, such as greater than 20 microns, or technologies that are too expensive for commercial use, such as liquid extractions under supercritical conditions.

There is thus a need for improved porous organo polysilica dielectric matrix materials with substantially smaller pore sizes and a greater percent by volume of pores for use in electronic components, and in particular, as an interlayer, or intermetal, dielectric material for use in the fabrication of integrated circuits.

SUMMARY OF THE INVENTION

It has now been surprisingly found that certain polymeric particles (or porogens) incorporated into an organo polysilica dielectric matrix provide porous films having a suitable dielectric constant and sufficiently small pore size for use as insulating material in electronic devices such as integrated circuits and printed wiring boards. Such polymeric particles provide organo polysilica dielectric matrix material having a greater percentage of pores by volume than is available from known porogens.

In a first aspect, the present invention is directed to a method of preparing porous organo polysilica dielectric materials including the steps of: a) dispersing removable polymeric porogen in a B-staged organo polysilica dielectric material; b) curing the B-staged organo polysilica dielectric material to form an organo polysilica dielectric matrix material without substantially degrading the porogen; and c) subjecting the organo polysilica dielectric matrix material to conditions which at least partially remove the porogen to form a porous organo polysilica dielectric material without substantially degrading the organo polysilica dielectric material; wherein the porogen is substantially compatible with the B-staged organo polysilica dielectric material and wherein the porogen includes as polymerized units at least one compound selected from silyl containing monomers or poly(alkylene oxide) monomers; provided that when the organo polysilica is methyl silsesquioxane and the porogen comprises (trimethoxylsilyl)propylmethacrylate as polymerized units, the porogen further includes as polymerized units at least one other compound selected from silyl containing monomers or poly(alkylene oxide) monomers.

In a second aspect, the present invention is directed to porous organo polysilica dielectric matrix materials prepared by the method described above.

In a third aspect, the present invention is directed to a method of preparing an integrated circuit including the steps of: a) depositing on a substrate a layer of a composition including B-staged organo polysilica dielectric material having polymeric porogen dispersed therein; b) curing the B-staged organo polysilica dielectric material to form an organo polysilica dielectric matrix material without substantially removing the porogen; c) subjecting the organo polysilica dielectric matrix material to conditions which at least partially remove the porogen to form a porous organo polysilica dielectric material layer without substantially degrading the organo polysilica dielectric material; d) patterning the organo polysilica dielectric layer; e) depositing a metallic film onto the patterned organo polysilica dielectric layer; and f) planarizing the film to form an integrated circuit; wherein the porogen is substantially compatible with the B-staged organo polysilica dielectric material and wherein the porogen includes as polymerized units at least one compound selected from silyl containing monomers or poly(alkylene oxide) monomers; provided that when the otgano polysilica is methyl silsesquioxane and the porogen includes (trimethoxylsilyl)propylmethacrylate as polymerized units, the porogen further includes as polymerized units at least one other compound selected from silyl containing monomers or poly(alkylene oxide) monomers.

In a fourth aspect, the present invention is directed to an integrated circuit prepared by the method described above.

In a fifth aspect, the present invention is directed to a composition including a B-staged organo polysilica dielectric material and a polymeric porogen, wherein the porogen is substantially compatible with the B-staged organo polysilica dielectric material and wherein the porogen includes as polymerized units at least one compound selected from silyl containing monomers or poly(alkylene oxide) monomers; provided that when the organo polysilica is methyl silsesquioxane and the porogen includes (trimethoxylsilyl)propylmethacrylate as polymerized units, the porogen further includes as polymerized units at least one other compound selected from silyl containing monomers or poly(alkylene oxide) monomers.

DETAILED DESCRIPTION OF THE INVENTION

As used throughout this specification, the following abbreviations shall have the following meanings, unless the context clearly indicates otherwise: ° C.=degrees centigrade; μm =micron; UV=ultraviolet; rpm=revolutions per minute; nm=nanometer; g=gram; wt %=weight percent; L=liter; mL=milliliter; RI=refractive index; MIAK=methyl iso-amyl ketone; MIBK=methyl iso-butyl ketone; PMA=poly(methyl acrylate); CyHMA=cyclohexylmethacrylate; EG=ethylene glycol; DPG=dipropylene glycol; DEA=diethylene glycol ethyl ether acetate; BzA=benzylacrylate; BzMA=benzyl methacrylate; MAPS=MATS =(trimethoxylsilyl)propylmethacrylate; PETTA=pentaerythriol tetra/triacetate; PPG4000DMA =polypropyleneglycol 4000 dimethacrylate; DPEPA=dipentaerythriol pentaacrylate; TMSMA =trimethylsilyl methacrylate; MOPTSOMS= methacryloxypropylbis(trimethylsiloxy)methylsilane; MOPMDMOS=3-methacryloxypropylmethyldimethoxysilane; TAT=triallyl-1,3,5-triazine-2,4,6-(IH,3H,5H)-trione; IBOMA=isobornyl methacrylate; PGMEA=propyleneglycol monomethylether acetate; and PGDMA=propyleneglycol dimethacrylate; PPODMMST=polypropylene oxide), bis (dimethoxymethylsilyl); TMOPTMA=trimethylolpropane trimethacrylate; TMOPTA=trimethylolpropane triacrylate; BPEPDMS=bis polyetherpolydimethylsilane; PPGMEA260 poly(propylene glycol) methyl ether acrylate having a molecular weight of about 260; PPGMEA475 =poly(propylene glycol) methyl ether acrylate having a molecular weight of about 475; PEGMEMA475 =poly(ethylene glycol) methyl ether methacrylate having a molecular weight of about 475; VTMS=vinyltrimethylsilane; and VTMOS=vinyltrimethoxysilane.

The term "(meth)acrylic" includes both acrylic and methacrylic and the term "(meth)acrylate" includes both acrylate and methacrylate. Likewise, the term "(meth)acrylamide" refers to both acrylamide and methacrylamide. "Alkyl" includes straight chain, branched and cyclic alkyl groups. The term "porogen" refers to a pore forming material, that is a polymeric material or particle dispersed in a dielectric material that is subsequently removed to yield pores, voids or free volume in the dielectric material. Thus, the terms "removable porogen," "removable polymer" and "removable particle" are used interchangeably throughout this specification. The terms "pore," "void" and "free volume" are used interchangeably throughout this specification. "Cross-linker" and "cross-linking agent" are used interchangeably throughout this specification. "Polymer" refers to polymers and oligomers. The term "polymer" also includes homopolymers and copolymers. The terms "oligomer" and "oligomeric" refer to dimers, trimers, tetramers and the like. "Monomer" refers to any ethylenically or acetylenically unsaturated compound capable of being polymerized. Such monomers may contain one or more double or triple bonds.

The term "B-staged" refers to uncured organo polysilica dielectric matrix materials. By "uncured" is meant any organo polysilica material that can be polymerized or cured, such as by condensation, to form higher molecular weight materials, such as coatings or films. Such B-staged material may be monomeric, oligomeric or mixtures thereof. B-staged material is further intended to include mixtures of polymeric material with monomers, oligomers or a mixture of monomers and oligomers. "Halo" refers to fluoro, chloro, bromo and iodo. Likewise, "halogenated" refers to fluorinated, chlorinated, brominated and iodinated. Unless otherwise noted, all amounts are percent by weight and all ratios are by weight. All numerical ranges are inclusive and combinable.

The present invention relates to the synthesis, composition, size, distribution and purity of polymer particles useful as removable porogens, i.e., pore forming material. Such porogens are useful for forming porous organo polysilica dielectric materials in the fabrication of electronic and optoelectronic devices.

Thus the present invention relates to a method of preparing porous organo polysilica dielectric materials. The process includes the steps of: a) dispersing removable polymeric porogen in a B-staged organo polysilica dielectric material; b) curing the B-staged organo polysilica dielectric material to form an organo polysilica dielectric matrix material without substantially degrading the porogen; and c) subjecting the organo polysilica dielectric matrix material to conditions which at least partially remove the porogen to form a porous organo polysilica dielectric material without substantially degrading the organo polysilica dielectric material; wherein the porogen is substantially compatible with the B-staged organo polysilica dielectric material and wherein the porogen includes as polymerized units at least one compound selected from silyl containing monomers or poly(alkylene oxide) monomers; provided that when the organo polysilica is methyl silsesquioxane and the porogen includes (trimethoxylsilyl)propylmethacrylate as polymerized units, the porogen further includes as polymerized units at least one other compound selected from silyl containing monomers or poly(alkylene oxide) monomers.

The porogens of the present invention are useful in reducing the dielectric constant of organo polysilica dielectric materials, particularly those materials having low dielectric constants ("k"). A low-k dielectric material is any material having a dielectric constant less than about 4.

By B-staged organo polysilica (or organo siloxane) is meant a compound including silicon, carbon, oxygen and hydrogen atoms and having the formula:

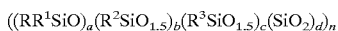

$$((RR^1SiO)_a(R^2SiO_{1.5})_b(R^3SiO_{1.5})_c(SiO_2)_d)_n$$

wherein R, $R^1$, $R^2$ and $R^3$ are independently selected from hydrogen, $(C_1-C_6)$alkyl, aryl, and substituted aryl; a, c and d are independently a number from 0 to 1; b is a number from 0.2 to 1; n is integer from about 3 to about 10,000; provided that a +b +c +d=1; and provided that at least one of R, $R^1$ and $R^2$ is not hydrogen. "Substituted aryl" refers to an aryl group having one or more of its hydrogens replaced by another substituent group, such as cyano, hydroxy, mercapto, halo, $(C_1-C_6)$alkyl, $(C_1-C_6)$alkoxy, and the like. In the above formula, a, b, c and d represent the mole ratios of each component. Such mole ratios can be varied between 0 and about 1. It is preferred that a is from 0 to about 0.8. It is also preferred that c is from 0 to about 0.8. It is further preferred that d is from 0 to about 0.8. In the above formula, n refers to the number of repeat units in the B-staged material. Preferably, n is an integer from about 3 to about 1000. It will be appreciated that prior to any curing step, the B-staged organo polysilica dielectric matrix materials may include one or more of hydroxyl or alkoxy end capping or side chain functional groups. Such end capping or side chain functional groups are known to those skilled in the art.

Suitable organo polysilica dielectric matrix materials include, but are not limited to, silsesquioxanes, partially condensed halosilanes or alkoxysilanes such as partially condensed by controlled hydrolysis tetraethoxysilane having number average molecular weight of about 500 to about 20,000, organically modified silicates having the composition $RSiO_3$ or $R_2SiO_2$ wherein R is an organic substituent, and partially condensed orthosilicates having $Si(OR)_4$ as the monomer unit. Silsesquioxanes are polymeric silicate materials of the type $RSiO_{1.5}$ where R is an organic substituent. Suitable silsesquioxanes are alkyl silsesquioxanes such as methyl silsesquioxane, ethyl silsesquioxane, propyl silsesquioxane, butyl silsesquioxane and the like; aryl silsesquioxanes such as phenyl silsesquioxane and tolyl silsesquioxane; alkyl/aryl silsesquioxane mixtures such as a mixture of methyl silsesquioxane and phenyl silsesquioxane; and mixtures of alkyl silsesquioxanes such as methyl silsesquioxane and ethyl silsesquioxane. B-staged silsesquioxane materials include homopolymers of silsesquioxanes, copolymers of silsesquioxanes or mixtures thereof. Such dielectric materials are generally commercially available or may be prepared by known methods.

It is preferred that the organo polysilica is a silsesquioxane, and more preferably methyl silsesquioxane, ethyl silsesquioxane, propyl silsesquioxane, iso-butyl silsesquioxane, tert-butyl silsesquioxane, phenyl silsesquioxane or mixtures thereof. Particularly useful silsesquioxanes include mixtures of hydrido silsesquioxanes with alkyl, aryl or alklylaryl silsesquioxanes. Typically, the silsesquioxanes useful in the present invention are used as oligomeric materials, generally having from about 3 to about 10,000 repeating units.

It will be appreciated that a mixture of dielectric materials may be used, such as two or more organo polysilica dielectric materials or a mixture of an organo polysilica dielectric matrix material with one or more other dielectric matrix materials, i.e. not an organo polysilica dielectric matrix material. Suitable other dielectric matrix materials include, but are not limited to, inorganic matrix materials such as carbides, oxides, nitrides and oxyfluorides of silicon, boron, or aluminum; and organic matrix materials such as benzocyclobutenes, poly(aryl esters), poly(ether ketones), polycarbonates, polyimides, fluorinated polyimides, polynorbornenes, poly(arylene ethers), polyaromatic hydrocarbons, such as polynaphthalene, polyquinoxalines, poly(perfluorinated hydrocarbons) such as poly(tetrafluoroethylene), and polybenzoxazoles.

It is preferred that when a mixture of an organo polysilica dielectric matrix material and another dielectric matrix material is used, the organo polysilica dielectric matrix material is present as a predominant component. It is further preferred that the organo polysilica dielectric matrix material in such admixtures is methyl silsesquioxane, phenyl silsesquioxane or mixtures thereof.

The porogen polymers are typically cross-linked particles and have a molecular weight or particle size suitable for use as a modifier in advanced interconnect structures in electronic devices. Typically, the useful particle size range for such applications is up to about 1,000 nm, such as that having a mean particle size in the range of about 0.5 to about 1000 nm. It is preferred that the mean particle size is in the range of about 0.5 to about 200 nm, more preferably from about 0.5 to about 50 nm, and most preferably from about 1 nm to about 20 nm. An advantage of the present process is that the size of the pores formed in the dielectric matrix are substantially the same size, i.e., dimension, as the size of the removed porogen particles used. Thus, the porous dielectric material made by the process of the present invention has substantially uniformly dispersed pores with substantially uniform pore sizes having a mean pore size in the range of from 0.5 to 1000 nm, preferably 0.5 to 200 nm, more preferably 0.5 and 50 nm and most preferably 1 to 20 nm.

The polymeric porogens include as polymerized units at least one compound selected from silyl containing monomers or poly(alkylene oxide) monomers. Such silyl containing monomers or poly(alkylene oxide) monomers may be used to form the uncrosslinked polymer, used as the crosslinker, or both. Any monomer containing silicon may be useful as the silyl containing monomers in the present invention. The silicon moiety in such silyl containing monomers may be reactive or unreactive. Exemplary "reactive" silyl containing monomers include those containing one or more alkoxy or acetoxy groups, such as, but not limited to, trimethoxysilyl containing monomers, triethoxysilyl containing monomers, methyl dimethoxysilyl containing monomers, and the like. Exemplary "unreactive" silyl containing monomers include those containing alkyl groups, aryl groups, alkenyl groups or mixtures thereof, such as but are not limited to, trimethylsilyl containing monomers, triethylsilyl containing monomers, phenyldimethylsilyl containing monomers, and the like. Polymeric porogens including silyl containing monomers as polymerized units are intended to include such porogens prepared by the polymerization of a monomer containing a silyl moiety. It is not intended to include a linear polymer that contains a silyl moiety only as end capping units.

Suitable silyl containing monomers include, but are not limited to, vinyltrimethylsilane, vinyltriethylsilane, vinyltrimethoxysilane, vinyltriethoxysilane, y-trimethoxysilylpropyl (meth)acrylate, divinylsilane, trivinylsilane, dimethyldivinylsilane, divinylmethylsilane, methyltrivinylsilane, diphenyldivinylsilane, divinylphenylsilane, trivinylphenylsilane, divinylmethylphenylsilane, tetravinylsilane, dimethylvinyldisiloxane, poly(methylvinylsiloxane), poly(vinylhydrosiloxane), poly(phenylvinylsiloxane), allyloxy-tert-butyldimethylsilane, allyloxytrimethylsilane, allyltriethoxysilane, allyltri-iso-propylsilane, allyltrimethoxysilane, allyltrimethylsilane, allyltriphenylsilane, diethoxy methylvinylsilane, diethyl methylvinylsilane, dimethyl ethoxyvinylsilane, dimethyl phenylvinylsilane, ethoxy diphenylvinylsilane, methyl bis(trimethylsilyloxy)vinylsilane, triacetoxyvinylsilane, triethoxyvinylsilane, triethylvinylsilane, triphenylvinylsilane, tris(trimethylsilyloxy)vinylsilane, vinyloxytrimethylsilane and mixtures thereof.

The amount of siliyl containing monomer useful to form the porogens of the present invention is typically from about 1 to about 99 % wt, based on the total weight of the monomers used. It is preferred that the silyl containing monomers are present in an amount of from 1 to about 80 % wt, and more preferably from about 5 to about 75 % wt.

Suitable poly(alkylene oxide) monomers include, but are not limited to, poly(propylene oxide) monomers, poly (ethylene oxide) monomers, poly(ethylene oxide/propylene oxide) monomers, poly(propylene glycol) (meth)acrylates, poly(propylene glycol) alkyl ether (meth)acrylates, poly (propylene glycol) phenyl ether (meth)acrylates, poly (propylene glycol) 4-nonylphenol ether (meth)acrylates, poly(ethylene glycol) (meth)acrylates, poly(ethylene glycol) alkyl ether (meth)acrylates, poly(ethylene glycol) phenyl ether (meth)acrylates, poly(propylene/ethylene glycol) alkyl ether (meth)acrylates and mixtures thereof. Preferred poly (alkylene oxide) monomers include trimethoylolpropane ethoxylate tri(meth)acrylate, trimethoylolpropane propoxylate tri(meth)acrylate, poly(propylene glycol) methyl ether acrylate, and the like. Particularly suitable poly(propylene glycol) methyl ether acrylate monomers are those having a molecular weight in the range of from about 200 to about 2000. The poly(ethylene oxide/propylene oxide) monomers useful in the present invention may be linear, block or graft copolymers. Such monomers typically have a degree of polymerization of from about 1 to about 50, and preferably from about 2 to about 50.

Typically, the amount of poly(alkylene oxide) monomers useful in the porogens of the present invention is from about 1 to about 99 % wt, based on the total weight of the monomers used. The amount of poly(alkylene oxide) monomers is preferably from about 2 to about 90 % wt, and more preferably from about 5 to about 80 % wt.

The silyl containing monomers and the poly(alkylene oxide) monomers may be used either alone or in combination to form the porogens of the present invention. It is preferred that the silyl containing monomers and the poly (alkylene oxide) monomers are used in combination. In general, the amount of the silyl containing monomers or the poly(alkylene oxide) monomers needed to compatiblize the porogen with the dielectric matrix depends upon the level of porogen loading desired in the matrix, the particular composition of the organo polysilica dielectric matrix, and the composition of the porogen polymer. When a combination of silyl containing monomers and the poly(alkylene oxide) monomers is used, the amount of one monomer may be decreased as the amount of the other monomer is increased. Thus, as the amount of the silyl containing monomer is increased in the combination, the amount of the poly (alkylene oxide) monomer in the combination may be decreased.

The polymers suitable for use as porogens in the present invention are derived from one or more ethylenically or acetylenically unsaturated monomers including as polymerized units one or more compounds selected from silyl containing monomers and poly(alkylene oxide) monomers. Such polymer porogens are removable, such as by the unzipping of the polymer chains to the original monomer units which are volatile and diffuse readily through the host matrix material. By "removable" is meant that the polymer particles depolymerize, degrade or otherwise break down into volatile components which can then diffuse through the host dielectric matrix film. Suitable monomers which may be copolymerized with the one or more silyl containing monomers or one or more poly(alkylene oxide) monomers or mixtures thereof include, but are not limited to: (meth) acrylic acid, (meth)acrylamides, alkyl (meth)acrylates, alkenyl (meth)acrylates, aromatic (meth)acrylates, vinyl aromatic monomers, nitrogen-containing compounds and their thio-analogs, and substituted ethylene monomers.

Typically, the alkyl (meth)acrylates useful in the present invention are ($C_1$–$C_{24}$) alkyl (meth)acrylates. Suitable alkyl (meth)acrylates include, but are not limited to, "low cut" alkyl (meth)acrylates, "mid cut" alkyl (meth)acrylates and "high cut" alkyl (meth)acrylates.

"Low cut" alkyl (meth)acrylates are typically those where the alkyl group contains from 1 to 6 carbon atoms. Suitable low cut alkyl (meth)acrylates include, but are not limited to: methyl methacrylate ("MMA"), methyl acrylate, ethyl acrylate, propyl methacrylate, butyl methacrylate ("BMA"), butyl acrylate ("BA"), isobutyl methacrylate ("IBMA"), hexyl methacrylate, cyclohexyl methacrylate, cyclohexyl acrylate and mixtures thereof.

"Mid cut" alkyl (meth)acrylates are typically those where the alkyl group contains from 7 to 15 carbon atoms. Suitable mid cut alkyl (meth)acrylates include, but are not limited to: 2-ethylhexyl acrylate ("EIA"), 2-ethylhexyl methacrylate, octyl methacrylate, decyl methacrylate. isodecyl methacrylate ("IDMA", based on branched ($C_{10}$)alkyl isomer mixture), undecyl methacrylate, dodecyl methacrylate (also known as lauryl methacrylate), tridecyl methacrylate, tetradecyl methacrylate (also known as myristyl methacrylate), pentadecyl methacrylate and mixtures thereof. Particularly useful mixtures include dodecyl-pentadecyl methacrylate ("DPMA"), a mixture of linear and branched isomers of dodecyl, tridecyl, tetradecyl and pentadecyl methacrylates; and lauryl-myristyl methacrylate ("LMA"). "High cut" alkyl (meth)acrylates are typically those where the alkyl group contains from 16 to 24 carbon atoms. Suitable high cut alkyl (meth)acrylates include, but are not limited to: hexadecyl methacrylate, heptadecyl methacrylate, octadecyl methacrylate, nonadecyl methacrylate, cosyl methacrylate, eicosyl methacrylate and mixtures thereof. Particularly useful mixtures of high cut alkyl (meth)acrylates include, but are not limited to: cetyl-eicosyl methacrylate ("CEMA"), which is a mixture of hexadecyl, octadecyl, cosyl and eicosyl methacrylate; and cetyl-stearyl methacrylate ("SMA"), which is a mixture of hexadecyl and octadecyl methacrylate.

The mid-cut and high-cut alkyl (meth)acrylate monomers described above are generally prepared by standard esterification procedures using technical grades of long chain aliphatic alcohols, and these commercially available alcohols are mixtures of alcohols of varying chain lengths containing between 10 and 15 or 16 and 20 carbon atoms in the alkyl group. Examples of these alcohols are the various Ziegler catalyzed ALFOL alcohols from Vista Chemical company, i.e., ALFOL 1618 and ALFOL 1620, Ziegler catalyzed various NEODOL alcohols from Shell Chemical Company, i.e. NEODOL 25L, and naturally derived alcohols such as Proctor & Gamble's TA-1618 and CO-1270. Consequently, for the purposes of this invention, alkyl (meth)acrylate is intended to include not only the individual alkyl (meth)acrylate product named, but also to include mixtures of the alkyl (meth)acrylates with a predominant amount of the particular alkyl (meth)acrylate named.

The alkyl (meth)acrylate monomers useful in the present invention may be a single monomer or a mixture having different numbers of carbon atoms in the alkyl portion. Also, the (meth)acrylamide and alkyl (meth)acrylate monomers useful in the present invention may optionally be substituted. Suitable optionally substituted (meth)acrylamide and alkyl (meth)acrylate monomers include, but are not limited to: hydroxy ($C_2$–$C_6$)alkyl (meth)acrylates, dialkylamino ($C_2$–$C_6$)-alkyl (metb)acrylates, dialkylamino($C_2$–$C_6$)alkyl (meth)acrylamides.

Particularly useful substituted alkyl (meth)acrylate monomers are those with one or more hydroxyl groups in the alkyl radical, especially those where the hydroxyl group is found at the β-position (2-position) in the alkyl radical. Hydroxyalkyl (meth)acrylate monomers in which the substituted alkyl group is a ($C_2$–$C_6$)alkyl, branched or unbranched, are preferred. Suitable hydroxyalkyl (meth)acrylate monomers include, but are not limited to: 2-hydroxyethyl methacrylate ("HEMA"), 2-hydroxyethyl acrylate ("HEA"), 2-hydroxypropyl methacrylate, 1-methyl-2-hydroxyethyl methacrylate, 2-hydroxy-propyl acrylate, I -methyl-2-hydroxyethyl acrylate, 2-hydroxybutyl methacrylate, 2-hydroxybutyl acrylate and mixtures thereof. The preferred hydroxyalkyl (meth)acrylate monomers are HEMA, 1-methyl-2-hydroxyethyl methacrylate, 2-hydroxypropyl methacrylate and mixtures thereof. A mixture of the latter two monomers is commonly referred to as "hydroxypropyl methacrylate" or "HPMA."

Other substituted (meth)acrylate and (meth)acrylamide monomers useful in the present invention are those with a dialkylamino group or dialkylaminoalkyl group in the alkyl radical. Examples of such substituted (meth)acrylates and (meth)acrylamides include, but are not limited to: dimethylaminoethyl methacrylate, dimethylaminoethyl acrylate, N,N-dimethylaminoethyl methacrylamide, N,N-dimethylaminopropyl methacrylamide, N,N-dimethylaminobutyl methacrylamide, N,N-di-ethylaminoethyl methacrylamide, N,N-diethylaminopropyl methacrylamide, N,N-diethylaminobutyl methacrylamide, N-(1,1-dimethyl-3-oxobutyl) acrylamide, N-(1,3-diphenyl- 1-ethyl-3-oxobutyl) acrylamide, N-(1-methyl-1-phenyl-3-oxobutyl) methacrylamide, and 2-hydroxyethyl acrylamide, N-methacrylamide of aminoethyl ethylene urea, N-methacryloxy ethyl morpholine, N-maleimide of dimethylaminopropylamine and mixtures thereof.

Other substituted (meth)acrylate monomers useful in the present invention are silicon-containing monomers such as γ-propyl tri($C_1$–$C_6$)alkoxysilyl (meth)acrylate, γ-propyl tri ($C_1$–$C_6$)alkylsilyl (meth)acrylate, γ-propyl di($C_1$–$C_6$) alkoxy($C_1$–$C_6$)alkylsilyl (meth)acrylate, γ-propyl di($C_1$–$C_6$) alkyl($C_1$–$C_6$)alkoxysilyl (meth)acrylate, vinyl tri($C_1$–$C_6$) alkoxysilyl (meth)acrylate, vinyl di($C_1$–$C_6$)alkoxy($C_1$–$C_6$) alkylsilyl (meth)acrylate, vinyl ($C_1$–$C_6$)alkoxydi($C_1$–$C_6$) alkylsilyl (meth)acrylate, vinyl tri($C_1$–$C_6$)alkylsilyl (meth) acrylate, and mixtures thereof.

The vinylaromatic monomers useful as unsaturated monomers in the present invention include, but are not limited to: styrene ("STY"), α-methylstyrene, vinyltoluene, p-methylstyrene, ethylvinylbenzene, vinylnaphthalene, vinylxylenes, and mixtures thereof. The vinylaromatic monomers also include their corresponding substituted counterparts, such as halogenated derivatives, i.e., containing one or more halogen groups, such as fluorine, chlorine or bromine; and nitro, cyano, ($C_1$–$C_{10}$)alkoxy, halo ($C_1$–$C_{10}$)alkyl, carb($C_1$–$C_{10}$)alkoxy, carboxy, amino, ($C_1$–$C_{10}$)alkylamino derivatives and the like.

The nitrogen-containing compounds and their thio-analogs useful as unsaturated monomers in the present invention include, but are not limited to: vinylpyridines such as 2-vinylpyridine or 4-vinylpyridine; lower alkyl ($C_1$–$C_8$) substituted N-vinyl pyridines such as 2-methyl-5-vinyl-pyridine, 2-ethyl-5-vinylpyridine, 3-methyl-5-vinylpyridine, 2,3-dimethyl-5-vinyl-pyridine, and 2-methyl-3-ethyl-5-vinylpyridine; methyl-substituted quinolines and isoquinolines; N-vinylcaprolactam; N-vinylbutyrolactam; N-vinylpyrrolidone; vinyl imidazole; N-vinyl carbazole; N-vinyl-succinimide; (meth)acrylonitrile; o-, m-, or p-aminostyrene; maleimide; N-vinyl-oxazolidone; N,N-dimethyl aminoethyl-vinyl-ether; ethyl-2-cyano acrylate; vinyl acetonitrile; N-vinylphthalimide; N-vinyl-pyrrolidones such as N-vinyl-thio-pyrrolidone, 3 methyl-1-vinyl-pyrrolidone, 4-methyl-1-vinyl-pyrrolidone, 5-methyl-1-vinyl-pyrrolidone, 3-ethyl-1-vinyl-pyrrolidone, 3-butyl-1-vinyl-pyrrolidone, 3,3-dimethyl-1-vinyl-pyrrolidone, 4,5-dimethyl- 1-vinyl-pyrrolidone, 5,5-dimethyl-1-vinyl-pyrrolidone, 3,3,5-trimethyl-1-vinyl-pyrrolidone, 4-ethyl-1-vinyl-pyrrolidone, 5-methyl-5-ethyl-1-vinyl-pyrrolidone and 3,4,5-trimethyl-1-vinyl-pyrrolidone; vinyl pyrroles; vinyl anilines; and vinyl piperidines.

The substituted ethylene monomers useful as unsaturated monomers is in the present invention include, but are not limited to: vinyl acetate, vinyl formamide, vinyl chloride, vinyl fluoride, vinyl bromide, vinylidene chloride, vinylidene fluoride and vinylidene bromide.

The polymers useful as porogens in the present invention may be prepared by a variety of polymerization techniques, such as solution polymerization or emulsion polymerization, and preferably by solution polymerization. The solution polymers useful in the present invention may be linear, branched or grafted and may be copolymers or homopolymers. Particularly suitable solution polymers include cross-linked copolymers. Typically, the molecular weight of these polymers is in the range of 5,000 to 1,000,000, preferably 10,000 to 500,000, and more preferably 10,000 to 100,000. The polydispersity of these materials is in the range of I to 20, preferably 1.001 to 15, and more preferably 1.001 to 10.

The solution polymers of the present invention are generally prepared in a non-aqueous solvent. Suitable solvents for such polymerizations are well known to those skilled in the art. Examples of such solvents include, but are not limited to: hydrocarbons, such as alkanes, fluorinated hydrocarbons, and aromatic hydrocarbons, ethers, ketones, esters, alcohols and mixtures thereof. Particularly suitable solvents include dodecane, mesitylene, xylenes, diphenyl ether, gamma-butyrolactone, ethyl lactate, propyleneglycol monomethyl ether acetate, caprolactone, 2-hepatanone, methylisobutyl ketone, diisobutylketone, propyleneglycol monomethyl ether, decanol, and t-butanol.

The solution polymers of the present invention may be prepared by a variety of methods, such as those disclosed in U.S. Pat. No. 5,863,996 (Graham) and U.S. patent application Ser. No. 09/460,326, both of which are hereby incorporated by reference to the extent they teach the preparation of such polymers. The emulsion polymers useful in the present invention are generally prepared the methods described in U.S. patent application Ser. No. 09/460,326, described above.

It is preferred that the polymers of the present invention are prepared using anionic polymerization or free radical polymerization techniques. It is also preferred that the polymers useful in the present invention are not prepared by step-growth polymerization processes.

The polymer particle porogens of the present invention include cross-linked polymer chains. Any amount of cross-linker is suitable for use in the present invention. Typically, the porogens of the present invention contain at least 1% by weight, based on the weight of the porogen, of cross-linker. Up to and including 100% cross-linking agent, based on the weight of the porogen, may be effectively used in the particles of the present invention. It is preferred that the amount of cross-linker is from about 1% to about 80%, and more preferably from about 1% to about 60%. It will be appreciated by those skilled in the art that as the amount of cross-linker in the porogen increases, the conditions for removal of the porogen from the dielectric matrix may change.

Suitable cross-linkers useful in the present invention include di-, tri-, tetra-, or higher multi-functional ethylenically unsaturated monomers. Examples of cross-linkers useful in the present invention include, but are not limited to: trivinylbenzene, divinyltoluene, divinylpyridine, divinylnaphthalene and divinylxylene; and such as ethyleneglycol diacrylate, trimethylolpropane triacrylate, diethyleneglycol divinyl ether, trivinylcyclohexane, allyl methacrylate ("ALMA"), ethyleneglycol dimethacrylate ("EGDMA"), diethyleneglycol dimethacrylate ("DEGDMA"), propyleneglycol dimethacrylate, propyleneglycol diacrylate, trimethylolpropane trimethacrylate ("TMPTMA"), divinyl benzene ("DVB"), glycidyl methacrylate, 2,2-dimethylpropane 1,3 diacrylate, 1,3-butylene glycol diacrylate, 1,3-butylene glycol dimethacrylate, 1,4-butanediol diacrylate, diethylene glycol diacrylate, diethylene glycol dimethacrylate, 1,6-hexanediol diacrylate, 1,6-hexanediol dimethacrylate, tripropylene glycol diacrylate, triethylene glycol dimethacrylate, tetraethylene glycol diacrylate, polyethylene glycol 200 diacrylate, tetraethylene glycol dimethacrylate, polyethylene glycol dimethacrylate, ethoxylated bisphenol A diacrylate, ethoxylated bisphenol A dimethacrylate, polyethylene glycol 600 dimethacrylate, poly(butanediol) diacrylate, pentaerythritol triacrylate, trimethylolpropane triethoxy triacrylate, glyceryl propoxy triacrylate, pentaerythritol tetraacrylate, pentaerythritol tetramethacrylate, dipentaerythritol monohydroxypentaacrylate, and mixtures thereof. Silyl containing monomers that are capable of undergoing cross-linking may also be used as cross-linkers, such as, but not limited to, divinylsilane, trivinylsilane, dimethyldivinylsilane, divinylmethylsilane, methyltrivinylsilane, diphenyldivinylsilane, divinylphenylsilane, trivinylphenylsilane, divinylmethylphenylsilane, tetravinylsilane, dimethylvinyldisiloxane, poly(methylvinylsiloxane), poly(vinylhydrosiloxane), poly(phenylvinylsiloxane), tetraallylsilane, 1,3-dimethyl tetravinyldisiloxane, 1,3-divinyl tetramethyldisiloxane and mixtures thereof.

The porogen particles of the present invention may be directly added to the B-staged organo polysilica dielectric matrix material as is or may be first purified to remove impurities that might effect the electrical or physical properties of electronic devices. Purification of the porogen particles may be accomplished either by precipitation of the porogen particles or adsorption of the impurities.

The solution polymer porogens of the present invention typically have a weight average molecular weight in the range of 5,000 to 1,000,000, preferably in the range of 10,000 to 500,000 and more preferably in the range of 10,000 to 100,000. The solution polymer porogens typically have a particle size up to about 1,000 nm, such as in the range of 0.5 to 1000 nm. It is preferred that the particle size is in the range of about 0.5 to about 200 nm, more preferably from about 0.5 about 50 nm, and most preferably from about 1 nm to about 20 nm. The polydispersity of these solution polymers is in the range 1 to 20 and more preferably in the range of 1.001 to 15 and most preferably in the range of 1.001 to 10.

To be useful as porogens in forming porous dielectric materials, the porogens of the present invention must be at least partially removable under conditions which do not adversely affect the dielectric matrix material, preferably substantially removable, and more preferably completely removable. By "removable" is meant that the polymer depolymerizes or otherwise breaks down into volatile components or fragments which are then removed from, or migrate out of, the dielectric material yielding pores or voids. Any procedures or conditions which at least partially remove the porogen without adversely affecting the dielectric matrix material may be used. It is preferred that the porogen is substantially removed. Typical methods of removal include, but are not limited to, exposure to heat or radiation, such as, but not limited to, UV, x-ray, gamma ray, alpha particles, neutron beam or electron beam. It is preferred that the matrix material is exposed to heat or UV light to remove the porogen.

The porogens of the present invention can be thermally removed under vacuum, nitrogen, argon, mixtures of nitrogen and hydrogen, such as forming gas, or other inert or reducing atmosphere. The porogens of the present invention may be removed at any temperature that is higher than the thermal curing temperature and lower than the thermal decomposition temperature of the organo polysilica dielectric matrix material. Typically, the porogens of the present invention may be removed at temperatures in the range of 150 to 500° C. and preferably in the range of 250 to 425° C. Typically, the porogens of the present invention are removed upon heating for a period of time in the range of 1 to 120 minutes. An advantage of the porogens of the present invention is that 0 to 20% by weight of the porogen remains after removal from the organo polysilica dielectric matrix material.

In one embodiment, when a porogen of the present invention is removed by exposure to radiation, the porogen polymer is typically exposed under an inert atmosphere, such as nitrogen, to a radiation source, such as, but not limited to, visible or ultraviolet light. The porogen fragments generated from such exposure are removed from the matrix material under a flow of inert gas. The energy flux of the radiation must be sufficiently high to generate a sufficient number of free radicals such that porogen particle is at least partially removed. It will be appreciated by those skilled in the art that a combination of heat and radiation may be used to remove the porogens of the present invention.

In preparing the dielectric matrix materials of the present invention, the porogens described above are first dispersed within, or dissolved in, a B-staged organo polysilica dielectric material. Any amount of porogen may be combined with the B-staged organo polysilica dielectric materials according to the present invention. The amount of porogen used will depend on the particular porogen employed, the particular B-staged organo polysilica dielectric material employed, and the extent of dielectric constant reduction desired in the resulting porous dielectric material. Typically, the amount of porogen used is in the range of from 1 to 90 wt %, based on the weight of the B-staged organo polysilica dielectric material, preferably from 10 to 80 wt %, and more preferably from 15 to 60 wt %. A particularly useful amount of porogen is in the range of form about 1 to about 60 wt %.

The porogens of the present invention may be combined with the B-staged organo polysilica dielectric material by any methods known in the art. Typically, the B-staged matrix material is first dissolved in a suitable high boiling solvent, such as, but not limited to, methyl isobutyl ketone, diisobutyl ketone, 2-heptanone, γ-butyrolactone, ε-caprolactone, ethyl lactate propyleneglycol monomethyl ether acetate, propyleneglycol monomethyl ether, diphenyl ether, anisole, n-amyl acetate, n-butyl acetate, cyclohexanone, N-methyl- 2-pyrrolidone, N,N'-dimethylpropyleneurea, mesitylene, xylenes, or mixtures thereof, to form a solution. The porogen particles are then dispersed or dissolved within the solution. The resulting dispersion is then deposited on a substrate by methods known in the art, such as spin coating, spray coating or doctor blading, to form a film or layer.

After being deposited on a substrate, the B-staged organo polysilica dielectric material is then substantially cured to form a rigid, cross-linked organo polysilica dielectric matrix material without substantially removing the porogen particle. The curing of the organo polysilica dielectric material may be by any means known in the art including, but not limited to, heating to induce condensation or e-beam irradiation to facilitate free radical coupling of the oligomer or monomer units. Typically, the B-staged material is cured by heating at an elevated temperature, e.g. either directly, e.g. heated at a constant temperature such as on a hot plate, or in a step-wise manner. Typically, the organo polysilica containing polymeric porogens is first annealed at a temperature of from about 200° to about 350° C., and then heated to a higher temperature, such as from about 400° to about 450° C. to at least partially remove the porogens. Such curing conditions are known to those skilled in the art.

Once the B-staged organo polysilica dielectric material is cured, the film is subjected to conditions which remove the porogen without substantially degrading the organo polysilica dielectric matrix material, that is, less than 5% by weight of the dielectric matrix material is lost. Typically, such conditions include exposing the film to heat and/or radiation. It is preferred that the matrix material is exposed to heat or light to remove the porogen. To remove the porogen thermally, the dielectric matrix material can be heated by oven heating or microwave heating. Under typical thermal removal conditions, the polymerized dielectric matrix material is heated to about 350° to 400° C. It will be recognized by those skilled in the art that the particular removal temperature of a thermally labile porogen will vary according to composition of the porogen. Upon removal, the porogen polymer depolymerizes or otherwise breaks down into volatile components or fragments which are then removed from, or migrate out of, the dielectric matrix material yielding pores or voids, which fill up with the carrier gas used in the process. Thus, a porous organo polysilica dielectric material having voids is obtained, where the size of the voids is substantially the same as the particle size of the porogen. The resulting dielectric material having voids thus has a lower dielectric constant than such material without such voids.

In general, the polymers of the present invention useful as porogens must be dispersible, miscible or otherwise substantially compatible with the host dielectric matrix material in solution and in the thin film. Thus, the porogen must be soluble in the same solvent or mixed solvent system as the host dielectric B-staged material. Also, the porogen must be present within this solution as substantially discrete, substantially non-aggregated or substantially non-agglomerated particles in order to achieve the desired benefit of this invention, namely substantially uniformly dispersed pores with a size comparable to that of the porogen's size. This is accomplished by modifying the porogen composition such that it is "compatible" with the host dielectric matrix material. Thus, the use of the appropriate substituted or functional monomers at an appropriate concentration in the preparation of the porogen allows for complete dispersion, or preferably dissolution, of the porogen polymers of the present invention into the host organo polysilica dielectric B-staged material.

An advantage of the present invention is that the porogens are selected so as to be substantially compatible, and preferably fully compatible, with the dielectric material used. By "compatible" is meant that a composition of B-staged organo polysilica dielectric material and porogen are optically transparent to visible light. It is preferred that a solution of B-staged organo polysilica dielectric material and porogen, a film or layer including a composition of B-staged organo polysilica dielectric material and porogen, a composition including a organo polysilica dielectric matrix material having porogen dispersed therein, and the resulting porous dielectric material after removal of the porogen are all optically transparent to visible light. By "substantially compatible" is meant that a composition of B-staged organo polysilica dielectric material and porogen is slightly cloudy or slightly opaque. Preferably, "substantially compatible" means at least one of a solution of B-staged organo polysilica dielectric material and porogen, a film or layer including a composition of B-staged organo polysilica dielectric material and porogen, a composition including an organo polysilica dielectric matrix material having porogen dispersed therein, and the resulting porous organo polysilica dielectric material after removal of the porogen is slightly cloudy or slightly opaque.

To be compatible, the porogen must be soluble or miscible in the B-staged organo polysilica dielectric material, in the solvent used to dissolve the B-staged organo polysilica dielectric material or both. When a film or layer of a composition including the B-staged organo polysilica dielectric material, porogen and solvent is cast, such as by spin casting, much of the solvent evaporates. After such film casting, the porogen must be soluble in the B-staged organo polysilica dielectric material so that it remains substantially uniformly dispersed. If the porogen is not compatible, phase separation of the porogen from the B-staged organo polysilica dielectric material occurs and large domains or aggregates form, resulting in an increase in the size and non-uniformity of pores. Such compatible porogens provide cured dielectric materials having substantially uniformly dispersed pores having substantially the same sizes as the porogen particles.

The compatibility of the porogens and organo polysilica dielectric matrix material is typically determined by a matching of their solubility parameters, such as the Van Krevelen parameters of delta h and delta v. See, for example, Van Krevelen et al., *Properties of Polymers. Their Estimation and Correlation with Chemical Structure*, Elsevier Scientific Publishing Co., 1976; Olabisi et al., *Polymer-Polymer Miscibility*, Academic Press, N.Y., 1979; Coleman et al., *Specific Interactions and the Miscibility of Polymer Blends*, Technomic, 1991; and A. F. M. Barton, *CRC Handbook of Solubility Parameters and Other Cohesion Parameters*, $2^{nd}$ Ed., CRC Press, 1991. Delta h is a hydrogen bonding parameter of the material and delta v is a measurement of both dispersive and polar interaction of the material. Such solubility parameters may either be calculated, such as by the group contribution method, or determined by measuring the cloud point of the material in a mixed solvent system consisting of a soluble solvent and an insoluble solvent. The solubility parameter at the cloud point is defined as the weighted percentage of the solvents. Typically, a number of cloud points are measured for the material and the central area defined by such cloud points is defined as the area of solubility parameters of the material.

When the solubility parameters of the porogen and organo polysilica dielectric matrix material are substantially similar, the porogen will be compatible with the dielectric matrix material and phase separation and/or aggregation of the porogen is less likely to occur. It is preferred that the solubility parameters, particularly delta h and delta v, of the porogen and organo polysilica dielectric matrix material are substantially matched. It will be appreciated by those skilled in the art that the properties of the porogen that affect the porogen's solubility also affect the compatibility of that porogen with the B-staged organo polysilica dielectric material. It will be further appreciated by those skilled in the art that a porogen may be compatible with one B-staged organo polysilica dielectric material, but not another. This is due to the difference in the solubility parameters of the different B-staged organo polysilica dielectric materials.

The compatible, i.e., optically transparent, compositions of the present invention do not suffer from agglomeration or long range ordering of porogen materials, i.e. the porogen is substantially uniformly dispersed throughout the B-staged organo polysilica dielectric material. Thus, the porous organo polysilica dielectric materials resulting from removal of the porogen have substantially uniformly dispersed pores. Such substantially uniformly dispersed, very small pores are very effective in reducing the dielectric constant of the dielectric materials.

A further advantage of the present invention is that low dielectric constant materials are obtained having uniformly dispersed voids, a higher volume of voids than known dielectric materials and/or smaller void sizes than known dielectric materials. These voids are on the order of 0.5 to 1000 nm, preferably 0.5 to 200 nm, more preferably 0.5 to 50 nm, and most preferably 1 to 20 nm. Further, the void size can be adjusted, from 1 to 1000 nm and above, by varying the size of the removable porogen particles. The resulting organo polysilica dielectric matrix material has low stress, low dielectric constant, low refractive index, improved toughness and improved compliance during mechanical contacting to require less contact force during compression.

The porous organo polysilica dielectric material made by the process of the present invention is suitable for use in any application where a low refractive index or low dielectric material may be used. When the porous dielectric material of the present invention is a thin film, it is useful as insulators, anti-reflective coatings, sound barriers, thermal breaks, insulation, optical coatings and the like. The porous organo polysilica dielectric materials of the present invention are preferably useful in electronic and optoelectronic devices including, but not limited to, the fabrication of multilevel integrated circuits, e.g. microprocessors, digital signal processors, memory chips and band pass filters, thereby increasing their performance and reducing their cost.

The porous organo polysilica dielectric matrix materials of the present invention are particularly suitable for use in integrated circuit manufacture. In one embodiment of integrated circuit manufacture, as a first step, a layer of a composition including B-staged organo polysilica dielectric material having a polymeric porogen dispersed or dissolved therein and optionally a solvent is deposited on a substrate. Suitable deposition methods include spin casting, spray casting and doctor blading. Suitable optional solvents include, but are not limited to: methyl isobutyl ketone, diisobutyl ketone, 2-heptanone, γ-butyrolactone, ε-caprolactone, ethyl lactate propyleneglycol monomethyl ether acetate, propyleneglycol monomethyl ether, diphenyl ether, anisole, n-amyl acetate, n-butyl acetate, cyclohexanone, N-methyl-2-pyrrolidone, N,N'-dimethylpropyleneurea, mesitylene, xylenes or mixtures thereof. Suitable substrates include, but are not limited to: silicon, silicon dioxide, silicon oxycarbide, silicon germanium, silicon-on-insulator, glass, silicon nitride, ceramics, aluminum, copper, gallium arsenide, plastics, such as polycarbonate, circuit boards, such as FR-4 and polyimide, and hybrid circuit substrates, such as aluminum nitride-alumina. Such substrates may further include thin films deposited thereon, such films including, but not limited to: metal nitrides, metal carbides, metal suicides, metal oxides, and mixtures thereof. In a multilayer integrated circuit device, an underlying layer of insulated, planarized circuit lines can also function as a substrate.

In a second step in the manufacture of integrated circuits, the layer of the composition is heated to an elevated temperature to cure the B-staged organo polysilica dielectric material to form an organo polysilica dielectric matrix material without degrading the polymeric porogen. A catalyst, such as a Bronsted or Lewis base or Bronsted or Lewis acid, may also be used. In a third step, the resulting cured organo polysilica dielectric matrix material is then subjected to conditions such that the porogen contained therein is substantially removed without adversely affecting the dielectric matrix material to yield a porous organo polysilica dielectric material. It is also optional to deposit a cap layer on the organo polysilica dielectric layer. Such optional cap layer before or after the porogen removal step. Suitable cap layers include dense dielectric materials such as, but not limited to, organo polysilica dielectric materials, silicon dioxide, silicon oxycarbide, silicon carbide, silicon-on-insulator, silicon nitride, silicon oxyfluorides, benzocyclobutenes, poly(arylene ethers), poly(aryl esters), poly(ether ketones), polycarbonates, polyimides, fluorinated polyimides, polynorbornenes, polyaromatic hydrocarbons such as polynaphthalene, polyquinoxalines, poly (perfluorinated hydrocarbons) such as poly (tetrafluoroethylene), and polybenzoxazoles. Typically, such cap layer materials are deposited by chemical vapor deposition, physical vapor deposition or spin-on processes, or other methods known to those skilled in the art.

The porous organo polysilica dielectric material is then lithographically patterned to form vias and/or trenches in subsequent processing steps. The trenches generally extend to the substrate and connect to at least one metallic via. Typically, lithographic patterning involves (i) coating the dielectric material layer with a positive or negative photoresist, such as those marketed by Shipley Company (Marlborough, Mass.); (ii) imagewise exposing, through a mask, the photoresist to radiation, such as light of appropriate wavelength or e-beam; (iii) developing the image in the resist, e.g., with a suitable developer; and (iv) transferring the image through the dielectric layer to the substrate with a suitable transfer technique such as reactive ion beam etching. Optionally, an antireflective composition may be disposed on the dielectric material prior to the photoresist coating. Such lithographic patterning techniques are well known to those skilled in the art.

A metallic film is then deposited onto the patterned dielectric layer to fill the trenches. Preferred metallic materials include, but are not limited to: copper, tungsten, gold, silver, aluminum or alloys thereof. The metal is typically deposited onto the patterned dielectric layer by techniques well known to those skilled in the art. Such techniques include, but are not limited to: chemical vapor deposition ("CVD"), plasma-enhanced CVD, combustion CVD ("CCVD"), electro and electroless deposition, sputtering, or the like. Optionally, a metallic liner, such as a layer of nickel, tantalum, titanium, tungsten, or chromium, including nitrides or silicides thereof, or other layers such as barrier or adhesion layers, e.g. silicon nitride or titanium nitride, is deposited on the patterned and etched dielectric material.

In a fifth step of the process for integrated circuit manufacture, excess metallic material is removed, e.g. by planarizing the metallic film, so that the resulting metallic material is generally level with the patterned dielectric layer. Planarization is typically accomplished with chemical/mechanical polishing or selective wet or dry etching. Such planarization methods are well known to those skilled in the art.

It will be appreciated by those skilled in the art that multiple layers of dielectric material, including multiple layers of organo polysilica dielectric material, and metal layers may subsequently be applied by repeating the above steps. It will be further appreciated by those skilled in the art that the compositions of the present invention are useful in any and all methods of integrated circuit manufacture.

The following examples are presented to illustrate further various aspects of the present invention, but are not intended to limit the scope of the invention in any aspect.

EXAMPLE 1

The compatibility of a number of porogen samples in a variety of commercially available methylsilsesquioxanes ("MeSQ") with varying molecular weights was determined. The various commercial MeSQ samples tested are reported in Table 1. MeSQ samples A and B are only methylsilsesquioxane and Sample C is a methylphenylsilsesquioxane. Compatibility determinations were performed by visually inspecting a film of the methyl silsesquioxane dielectric matrix material and porogen that was spun cast on a silicon wafer. All visual inspections were by naked-eye under daylight. All samples were clear unless otherwise noted. The porogen samples are reported as the monomers used to prepare the porogen sample along with the ratio of the monomers used. The indices of refraction of the samples were also determined. The compatibility results are reported in Table 2. Different loadings of porogen in the MeSQ matrices were evaluated. The loading levels are reported in Table 2 in percent by weight.

TABLE 1

| MeSQ Matrix | Molecular Weight | Hydroxy Content |
|---|---|---|
| A | High | Low |
| B | Low | High |
| C | Medium | Medium |

TABLE 2

| Porogen | MeSQ Sample | Porogen % | R.I. |
|---|---|---|---|
| None | A | | 1.372 |
| | | | 1.367 |
| None | B | | 1.365 |
| None | C | | 1.502 |
| None | A/C (9:1) | | 1.374 |
| | | | 1.374 |
| MMA/TMSOEMA/ALMA (60/30/10) | A | 50 | smoky |
| MMA/TMSOEMA/ALMA (60/30/10) | B | 50 | 1.216 |
| MMA/VTMS/ALMA (45/45/10) | A | 50 | smoky |
| MMA/VTMS/ALMA (45/45/10) | B | 50 | 1.228 |
| MMA/TMSMA/ALMA (45/45/10) | A | 50 | smoky |
| MMA/TMSMA/ALMA (45/45/10) | B | 50 | opaque |
| MMA/MAPS/ALMA (60/30/10) | A | 30 | 1.353 |
| MMA/MAPS/ALMA (60/30/10) | A | 30 | 1.359 |
| MMA/MAPS/ALMA (45/45/10) | A | 30 | 1.359 |

TABLE 2-continued

| Porogen | MeSQ Sample | Porogen % | R.I. |
|---|---|---|---|
| MMA/MAPS/ALMA (45/45/10) | | 30 | 1.349 (smoky) |
| | C | 30 | 1.503 |
| MMA/MAPS/ALMA (30/60/10) | A | 50 | 1.391 |
| MMA/MAPS/ALMA (30/60/10) | B | 50 | 1.365 |
| MA/MAPS/ALMA (10/80/10) | A | 50 | 1.376 |
| MA/MAPS/ALMA (10/80/10) | A/C (9:1) | 50 | |
| MA/MAPS/ALMA (30/60/10) | A | 50 | 1.373 |
| MA/MAPS/ALMA (30/60/10) | A/C (9:1) | 50 | |
| MMA/MAPTMSMS/ALMA (10/80/10) | A | 50 | 1.364 |
| MMA/MAPTMSMS/ALMA (10/80/10) | A/C (9:1) | 50 | |
| MMA/MAPMDMOS/ALMA (10/80/10) | A | 50 | 1.372 |
| MMA/MAPMDMOS/ALMA (10/80/10) | B | 50 | 1.327 |
| BA/MAPS/TMPTMA (18/72/10) | A | 50 | 1.370 |
| BA/MAPS/TMPTMA (18/72/10) | A/C (9:1) | 50 | |
| BA/MAPS/TMPTMA (45/45/10) | A | 50 | 1.371 |
| BA/MAPS/TMPTMA (45/45/10) | B | 50 | 1.323 |
| BA/MAPS/TMPTMA (72/18/10) | A | 50 | 1.353 |
| BA/MAPS/TMPTMA (72/18/10) | B | 50 | 1.263 |
| | B | 50 | opaque |
| | C | 50 | 1.440/1.502 |
| | | 30 | 1.5 |
| BA/HPMA/MAPS/TMPTMA (15/60/15/10) | A | 50 | NA |
| BA/HPMA/MAPS/TMPTMA (15/60/15/10) | | 30 | opaque |
| | A/C (9:1) | 50 | opaque |
| | B | 50 | 1.272 |
| | C | 50 | 1.508/1.502 |
| | | 30 | 1.506 |
| BA/HPMA/MAPS/TMPTMA (60/15/15/10) | A | 50 | 1.353 (smoky) |
| BA/HPMA/MAPS/TMPTMA (60/15/15/10) | A/C (9:1) | 30 | 1.368 |
| | | 50 | smoky |
| | B | 50 | 1.333 |
| | C | 50 | gel |
| BA/HPMA/MAPS/TMPTMA (15/15/60/10) | A | 50 | 1.381 |
| BA/HPMA/MAPS/TMPTMA (15/15/60/10) | A/C (9:1) | 50 | 1.390 |
| | B | 50 | 1.197 |
| BA/VTMOS/DVB (80/10/10) | C | 50 | 1.523/1.502 |
| BA/VTMOS/DVB (80/10/10) | A/C (9:1) | 50 | 1.360 (smoky) |
| | B | 50 | 1.214 |
| BA/VTMOS/DVB (85/5/10) | C | 50 | 1.531/1.502 |
| BA/VTMOS/DVB (85/5/10) | A/C (9:1) | 50 | 1.364 (smoky) |
| | B | 50 | 1.273 |
| PPGMEA260/VTMOS/DVB (80/10/10) | C | 50 | 1.526/1.502 |
| PPGMEA260/VTMOS/DVB (80/10/10) | A/C (9:1) | 50 | 1.367 |
| | B | 50 | 1.232 |
| | A | 30 | 1.304 |
| PEGMEMA475/VTMOS/DVB (80/10/10) | C | 50 | 1.520/1.502 |
| PEGMEMA475/VTMOS/DVB (80/10/10) | A/C (9:1) | 30 | 1.354 |
| | | 50 | 1.356 |
| | B | 50 | 1.251 |
| | A | 30 | 1.292 |
| PPGMEA260/VTMS/DVB (80/10/10) | C | 50 | gel |
| PPGMEA260/VTMS/DVB (80/10/10) | | 30 | 1.515 |
| | A/C (9:1) | 50 | 1.325 |
| | B | 50 | 1.230 |
| | A | 30 | 1.334 (smoky) |
| PEGMEMA475/VTMOS/TMPTMA | C | 30 | 1.510 |

TABLE 2-continued

| Porogen | MeSQ Sample | Porogen % | R.I. |
|---|---|---|---|
| (80/10/10) | | | |
| PEGMEMA475/VTMOS/TMPTMA (80/10/10) | A/C (9:1) | 50 | 1.329 |
| | B | 50 | 1.210 |
| PEGMEMA475/VTMS/TMPTMA (80/10/10) | C | 50 | 1.523 |
| PEGMEMA475/VTMS/TMPTMA (80/10/10) | A/C (9:1) | 50 | opaque |
| | B | 50 | 1.263 |
| PPGMEA260/VTMOS/TMPTMA (80/10/10) | C | 50 | 1.530/1.502 |
| PPGMEA260/VTMOS/TMPTMA (80/10/10) | A/C (9:1) | 50 | 1.371 |
| | B | 50 | 1.218 |
| | A | 30 | 1.272 (smoky) |
| PPGMEA260/VTMS/TMPTMA (80/10/10) | C | 50 | 1.525 |
| PPGMEA260/VTMS/TMPTMA (80/10/10) | | 30 | 1.508 |
| | A/C (9:1) | 50 | 1.36 |
| | B | 50 | opaque |
| | A | 30 | opaque |
| BA/VTMS/TMPTMA (80/10/10) | C | 50 | 1.512/1.502 |
| BA/VTMS/TMPTMA (80/10/10) | | 30 | 1.500 |
| | A/C (9:1) | 50 | opaque |

Smoky refers to compositions that are very slightly cloudy. Clear samples result when the porogen and the MeSQ matrix material are at least substantially compatible. Samples having a lower refractive index than the MeSQ control sample are indicative of dielectric lowering of the MeSQ matrix material. Thus, the above data clearly show that the porogens of the present invention are substantially compatible with organo polysilica dielectric material.

EXAMPLE 2

Porous dielectric films were prepared using polymer porogens of the present invention. A methyl silsesquioxanes ("MeSQ") sample was prepared by combining MeSQ matrix C (0.026.5 g) and MeSQ matrix A (0.21 g) with a porogen having as polymerized units PEGMEMA475/VTMOS/TMPTMA (80/10/10) in propylene glycol methyl ether acetate (1.55 g, 15 wt %). The sample was deposited on a silicon wafer as a thin coating using spin casting. The thickness (estimated at ~1.3 μm) of the film was controlled by the duration and spin rate of spread cycle, drying cycle and final spin cycle. The wafer was then processed at 150° C. for 1 minute followed by heating in a PYREX™ container in an oven to 200° C. under an argon atmosphere. The oxygen content of the container was monitored and maintained below 5 ppm before heating of the sample. After 30 minutes at 200° C., the furnace was heated at a rate of 10° C. per minute to a temperature of 420° C. and held for 60 minutes. The decomposition of the polymer particle was accomplished at this temperature without expansion of the polymer

What is claimed is:

1. A method of preparing porous organo polysilica dielectric materials comprising the steps of: a) dispersing removable cross-linked polymeric porogen particle in a B-staged organo polysilica dielectric material; b) curing the B-staged organo polysilica dielectric material to form an organo polysilica dielectric matrix material without substantially degrading the porogen particle; and c) subjecting the organo polysilica dielectric matrix material to conditions which at least partially remove the porogen particle to form a porous organo polysilica dielectric material without substantially degrading the organo polysilica dielectric material; wherein the porogen particle is substantially compatible with the B-staged organo polysilica dielectric material and wherein the porogen particle comprises as polymerized units at least one compound selected from silyl containing monomers or poly(alkylene oxide) monomers and at least one cross-linking agent; provided that when the organo polysilica is methyl silsesquioxane and the porogen particle comprises (trimethoxylsilyl)propylmethacrylate as polymerized units, the porogen particle further comprises as polymerized units at least one other compound selected from silyl containing monomers or poly(alkylene oxide) monomers.

2. The method of claim 1 wherein the polymeric porogen has a particle size in the range of from about 0.5 to about 1000 nm.

3. The method of claim 2 wherein the particle size is in the range of from about 0.5 to about 200 nm.

4. The method of claim 1 wherein the silyl containing monomer is selected from vinyltrimethylsilane, vinyltriethylsilane, vinyltrimethoxysilane, vinyltriethoxysilane, γ-trimethoxysilylpropyl (meth)acrylate, divinylsilane, trivinylsilane, dimethyldivinylsilane, divinylmethylsilane, methyltrivinylsilane, diphenyldivinylsilane, divinylphenylsilane, trivinylphenylsilane, divinylmethylphenylsilane, tetravinylsilane, dimethylvinyldisiloxane, poly (methylvinylsiloxane), poly(vinylhydrosiloxane), poly (phenylvinylsiloxane), allyloxy-tert-butyldimethylsilane, allyloxytrimethylsilane, allyltriethoxysilane, allyltri-iso-propylsilane, allyltrimethoxysilane, allyltrimethylsilane, allyltriphenylsilane, diethoxy methylvinylsilane, diethyl methylvinylsilane, dimethyl ethoxyvinylsilane, dimethyl phenylvinylsilane, ethoxy diphenylvinylsilane, methyl bis (trimethylsilyloxy)vinylsilane, triacetoxyvinylsilane, triethoxyvinylsilane, triethylvinylsilane, triphenylvinylsilane, tris(trimethylsilyloxy)vinylsilane, vinyloxytrimethylsilane or mixtures thereof.

5. The method of claim 1 wherein the poly(alkylene oxide) monomers are selected from poly(propylene oxide) monomers, poly(ethylene oxide) monomers, poly(ethylene oxide/propylene oxide) monomers, poly(propylene glycol) (meth)acrylates, poly(propylene glycol) alkyl ether (meth) acrylates, poly(propylene glycol) phenyl ether (meth) acrylates, poly(propylene glycol) 4-nonylphenol ether (meth)acrylates, poly(ethylene glycol) (meth)acrylates, poly (ethylene glycol) alkyl ether (meth)acrylates, poly(ethylene glycol) phenyl ether (meth)acrylates, poly(propylene/ethylene glycol) alkyl ether (meth)acrylates or mixtures thereof.

6. The method of claim 1 wherein the B-staged organo polysilica dielectric matrix material has the formula:

$$((RR^1SiO)_a(R^2SiO_{1.5})_b(R^3SiO_{1.5})_c(SiO_2)_d)_n$$

wherein R, $R^1$, $R^2$ and $R^3$ are independently selected from hydrogen, $(C_1-C_6)$alkyl, aryl, and substituted aryl; a, c and d are independently a number from 0 to 1; b is a number from 0.2 to 1; n is integer from about 3 to about 10,000; provided that a +b +c +d=1; and provided that at least one of R, $R^1$ and $R^2$ is not hydrogen.

7. The method of claim 6 wherein the B-staged organo polysilica dielectric matrix material is selected from methyl silsesquioxane, phenyl silsesquioxane or mixtures thereof.

8. The method of claim 1 wherein the B-staged organo polysilica dielectric material further comprises one or more other dielectric materials.

9. A porous organo polysilica dielectric matrix materials prepared by the method of claim 1.

10. A method of preparing an integrated circuit comprising the steps of: a) depositing on a substrate a layer of a composition comprising B-staged organo polysilica dielectric material having cross-linked polymeric porogen particles dispersed therein; b) curing the B-staged organo polysilica dielectric material to form an organo polysilica dielectric matrix material without substantially removing the porogen particles; c) subjecting the organo polysilica dielectric matrix material to conditions which at least partially remove the porogen particles to form a porous organo polysilica dielectric material layer without substantially degrading the organo polysilica dielectric material; d) patterning the organo polysilica dielectric layer; e) depositing a metallic film onto the patterned organo polysilica dielectric layer; and f) planarizing the film to form an integrated circuit; wherein the porogen particle is substantially compatible with the B-staged organo polysilica dielectric material and wherein the porogen particle comprises as polymerized units at least one compound selected from silyl containing monomers or poly(alkylene oxide) monomers and at least one cross-linking agent; provided that when the organo polysilica is methyl silsesquioxane and the porogen particle includes (trimethoxylsilyl)propylmethacrylate as polymerized units, the porogen particle further includes as polymerized units at least one other compound selected from silyl containing monomers or poly(alkylene oxide) monomers.

11. The method of claim 10 wherein the polymeric porogen has a particle size in the range of from about 0.5 to about 1000 nm.

12. The method of claim 10 wherein the silyl containing monomer is selected from vinyltrimethylsilane, vinyltriethylsilane, vinyltrimethoxysilane, vinyltriethoxysilane, γ-trimethoxysilylpropyl (meth)acrylate, divinylsilane, trivinylsilane, dimethyldivinylsilane, divinylmethylsilane, methyltrivinylsilane, diphenyldivinylsilane, divinylphenylsilane, trivinylphenylsilane, divinylmetbylphenylsilane, tetravinylsilane, dimethylvinyldisiloxane, poly(methylvinylsiloxane), poly(vinylhydrosiloxane), poly(phenylvinylsiloxane), allyloxy-tert-butyldimethylsilane, allyloxytrimethylsilane, allyltriethoxysilane, allyltri-isopropylsilane, allyltrimethoxysilane, allyltrimethylsilane, allyltriphenylsilane, diethoxy methylvinylsilane, diethyl methylvinylsilane, dimethyl ethoxyvinylsilane, dimethyl phenylvinylsilane, ethoxy diphenylvinylsilane, methyl bis(trimethylsilyloxy)vinylsilane, triacetoxyvinylsilane, triethoxyvinylsilane, triethylvinylsilane, triphenylvinylsilane, tris(trimethylsilyloxy)vinylsilane, vinyloxytrimethylsilane or mixtures thereof.

13. The method of claim 10 wherein the poly(alkylene oxide) monomers are selected from poly(propylene oxide) monomers, poly(ethylene oxide) monomers, poly(ethylene oxide/propylene oxide) monomers, poly(propylene glycol) (meth)acrylates, poly(propylene glycol) alkyl ether (meth)acrylates, poly(propylene glycol) phenyl ether (meth)acrylates, poly(propylene glycol) 4-nonylphenol ether (meth)acrylates, poly(ethylene glycol) (meth)acrylates, poly(ethylene glycol) alkyl ether (meth)acrylates, poly(ethylene glycol) phenyl ether (meth)acrylates, poly(propylenelethylene glycol) alkyl ether (meth)acrylates or mixtures thereof.

14. The method of claim 10 wherein the B-staged organo polysilica dielectriic matrix material has the formula:

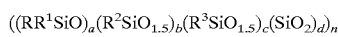

wherein R, R$^1$, R$^2$ and R$^3$ are independently selected from hydrogen, (C$_1$–C$_6$)alkyl, aryl, and substituted aryl; a, c and d are independently a number from 0 to 1; b is a number from 0.2 to 1; n is integer from about 3 to about 10,000; provided that a+b+c+d=1; and provided that at least one of R, R$^1$ and R$^2$ is not hydrogen.

15. A device prepared by the method of claim 10.

16. A composition comprising a B-staged organo polysilica dielectric material and a cross-linked polymeric porogen particle, wherein the porogen particle is substantially compatible with the B-staged organo polysilica dielectric material and wherein the porogen particle includes as polymerized units at least one compound selected from silyl containing monomers or poly(alkylene oxide) monomers and at least one cross-linking agent; provided that when the organo polysilica is methyl silsesquioxane and the porogen particle comprises (trimethoxylsilyl)propylmethacrylate as polymerized units, the porogen particle further comprises as polymerized units at least one other compound selected from silyl containing monomers or poly(alkylene oxide) monomers.

17. The composition of claim 16 wherein the polymeric porogen has a particle size in the range of from about 0.5 to about 1000 nm.

18. The composition of claim 16 wherein the silyl containing monomer is selected from vinyltrimethylsilane, vinyltriethylsilane, vinyltrimethoxysilane, vinyltriethoxysilane, γ-trimethoxysilylpropyl (meth)acrylate, divinylsilane, trivinylsilane, dimethyldivinylsilane, divinylmethylsilane, methyltrivinylsilane, diphenyldivinylsilane, divinylphenylsilane, trivinylphenylsilane, divinylmethylphenylsilane, tetravinylsilane, dimethylvinyldisiloxane, poly(methylvinylsiloxane), poly(vinylhydrosiloxane), poly(phenylvinylsiloxane), allyloxy-tert-butyldimethylsilane, allyloxytrimethylsilane, allyltriethoxysilane, allyltri-isopropylsilane, allyltrimethoxysilane, allyltrimethylsilane, allyltriphenylsilane, diethoxy methylvinylsilane, diethyl methylvinylsilane, dimethyl ethoxyvinylsilane, dimethyl phenylvinylsilane, ethoxy diphenylvinylsilane, methyl bis(trimethylsilyloxy)vinylsilane, triacetoxyvinylsilane, triethoxyvinylsilane, triethylvinylsilane, triphenylvinylsilane, tris(trimethylsilyloxy)vinylsilane, vinyloxytrimethylsilane or mixtures thereof.

19. The composition of claim 16 wherein the B-staged organo polysilica dielectric matrix material has the formula:

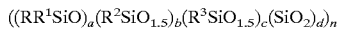

wherein R, R$^1$, R$^2$ and R$^3$ are independently selected from hydrogen, (C$_1$–C$_6$)alkyl, aryl, and substituted aryl; a, c and d are independently a number from 0 to 1; b is a number from 0.2 to 1; n is integer from about 3 to about 10,000; provided that a+b+c+d=1; and provided that at least one of R, R$^1$ and R$^2$ is not hydrogen.

20. The composition of claim 19 wherein the B-staged organo polysilica dielectric matrix is selected from methyl silsesquioxane, phenyl silsesquioxane or mixtures thereof.

21. The composition of claim 16 wherein the poly(alkylene oxide) monomers are selected from poly(propylene oxide) monomers, poly(ethylene oxide) monomers, poly(ethylene oxide/propylene oxide) monomers, poly(propylene glycol) (meth)acrylates, poly(propylene glycol) alkyl ether (meth)acrylates, poly(propylene glycol) pbenyl ether (meth)acrylates, poly(propylene glycol) 4-nonylphenol ether (meth)acrylates, poly(ethylene glycol) (meth)acrylates, poly(ethylene glycol) alkyl ether (meth)acrylates, poly(ethylene glycol) phenyl ether (meth)acrylates, poly(propylene/ethylene glycol) alkyl ether (meth)acrylates or mixtures thereof.

22. The composition of claim 16 wherein the porogen is compatible with the B-staged organo polysilica dielectric material.

23. A method of preparing porous organo polysilica dielectric materials comprising the steps of: a) dispersing cross-linked removable polymeric porogen particle in a B-staged organo polysilica dielectric material; b) curing the B-staged organo polysilica dielectric material to form an organo polysilica dielectric matrix material without substantially degrading the porogen particle; and c) subjecting the organo polysilica dielectric matrix material to conditions which at least partially remove the porogen particle to form a porous organo polysilica, dielectric material without substantially degrading the organo polysilica dielectric material; wherein the porogen particle is substantially compatible with the B-staged organo polysilica dielectric material and wherein the porogen particle comprises as polymerized units at least one compound selected from silyl containing monomers or poly(alkylene oxide) monomers and at least one cross-linking agent.

24. A method of preparing an integrated circuit comprising the steps of: a) depositing on a substrate a layer of a composition comprising B-staged organo polysilica dielectric material having cross-linked polymeric porogen particles dispersed therein; b) curing the B-staged organo polysilica dielectric material to form an organo polysilica dielectric matrix material without substantially removing the porogen particles; c) subjecting the organo polysilica dielectric matrix material to conditions which at least partially remove the porogen particles to form a porous organo polysilica dielectric material layer without substantially degrading the organo polysilica dielectric material; d) patterning the organo polysilica dielectric layer; e) depositing a metallic film onto the patterned organo polysilica dielectric layer; and f) planarizing the film to form an integrated circuit; wherein the porogen particle is substantially compatible with the B-staged organo polysilica dielectric material and wherein the porogen particle comprises as polymerized units at least one compound selected from silyl containing monomers or poly(alkylene oxide) monomers and at least one cross-linking agent.

25. A composition comprising a B-staged organo polysilica dielectric material and a cross-linked polymeric porogen particle, wherein the porogen particle is substantially compatible with the B-staged organo polysilica dielectric material and wherein the porogen particle includes as polymerized units at least one compound selected from silyl containing monomers or poly(alkylene oxide) monomers and at least one cross-linking agent.

26. The method of claim 8 wherein the one or more other dielectric materials are selected from silicon oxides, boron oxides, aluminum oxides, silicon nitrides, boron nitrides, aluminum nitrides, silicon oxyfluorides, boron oxyfluorides, aluminum oxyfluorides, benzocyclobutenes, poly(aryl esters), poly(ether ketones), polycarbonates, polyimides, fluorinated polyimides, polynorbornenes, poly(arylene ethers), polynaphthalene, polyquinoxalines, poly(perfluorinated hydrocarbons) or polybenzoxazoles.

* * * * *